(12) United States Patent
Roy et al.

(10) Patent No.: US 6,692,269 B2
(45) Date of Patent: Feb. 17, 2004

(54) CIRCUIT MODULE WITH UNIVERSAL CONNECTIVITY

(75) Inventors: Apurba Roy, Carlsbad, CA (US); Milivoje Slobodan Brkovic, Carlsbad, CA (US)

(73) Assignee: di/dt, Inc., Carlsbad, CA (US)

( * ) Notice: Subject to any disclaimer, the term of this patent is extended or adjusted under 35 U.S.C. 154(b) by 14 days.

(21) Appl. No.: 09/737,410

(22) Filed: Dec. 15, 2000

(65) Prior Publication Data

US 2002/0076958 A1 Jun. 20, 2002

(51) Int. Cl.[7] ............................................. H01R 12/00
(52) U.S. Cl. ........................................ 439/83; 439/82
(58) Field of Search ............................ 439/82, 83, 65, 439/74, 75, 79; 174/261, 268, 154; 29/840

(56) References Cited

U.S. PATENT DOCUMENTS

| | | | | |
|---|---|---|---|---|
| 5,484,964 A | * | 1/1996 | Dawson et al. | 174/261 |
| 5,909,011 A | * | 6/1999 | Chartrand et al. | 174/261 |
| 6,081,996 A | * | 7/2000 | Kruppa et al. | 29/840 |
| 6,257,904 B1 | * | 7/2001 | Lin | 439/83 |
| 6,259,039 B1 | * | 7/2001 | Chroneos, Jr. et al. | 174/263 |

* cited by examiner

*Primary Examiner*—Alexander Gilman
(74) *Attorney, Agent, or Firm*—Lowenstein Sandler PC

(57) ABSTRACT

In accordance with the invention, a circuit module is provided with a plurality of dual capacity connector pads, each pad holding a miniature surface mount connector and/or a connection pin. The preferred I-channel surface mount connector is sufficiently small that the module can be connected by either surface mount or pin to the same region of the circuit board.

12 Claims, 3 Drawing Sheets

CIRCUIT MODULE WITH UNIVERSAL CONNECTIVITY

FIELD OF THE INVENTION

This invention relates to a circuit module for interconnection with a circuit board or substrate and, in particular, to a circuit module adapted for interconnection by any one of a number of prevalent approaches for interconnection. The circuit module can comprise an IC package, a circuit board or a substrate.

BACKGROUND OF THE INVENTION

As electronic circuits become denser, faster and increasingly complex, interconnections between them are subject to more demanding requirements. With the great increase in the density of active components, interconnection devices become large consumers of available volume. And increased density brings an increase in required currents and power dissipation, aggravating thermal mismatch between connected circuit devices. In addition, higher circuit device speeds place stricter constraints on tolerable interconnect inductance.

These rapidly changing requirements have produced a variety of approaches for connecting a circuit module with a circuit board. In one approach, known as PTH interconnect, the circuit module is provided with a plurality of connection pins and the circuit board has a corresponding pattern of plated through holes (hence the acronym "PTH") for receiving the pins. The pins are inserted into the holes and soldered to the board. Typically the pins extend through the board and are soldered on the back side.

In a second approach, called surface mount interconnection, the circuit module is provided with bent interconnection leads ("gull wings" bending away from the module or "J-leads" bending toward the module). The circuit board surface has a pattern of bonding pads for receiving the bent leads, and the leads are soldered in place on the surface.

A third approach is referred to as socket connection. As in PTH interconnection, the circuit module has connection pins. But rather than through holes, the board is connected with a modular unit containing conductive receiving holes ("sockets") for the pins.

Different system fabricators use different ones of these interconnection schemes for the same modular circuits. Consequently a module fabricator may have to provide the same circuit in multiple different modules. Accordingly, there is a need for a circuit module having universal connectivity using the dominant circuit board connection schemes.

SUMMARY OF THE INVENTION

In accordance with the invention, a circuit module is provided with a plurality of dual capacity connector pads, each pad holding a miniature surface mount connector and/or a connection pin. The preferred I-channel surface mount connector is sufficiently small that the module can be connected by either surface mount or pin to the same region of the circuit board.

BRIEF DESCRIPTION OF THE DRAWINGS

The nature, advantages and various additional features of the invention will appear more fully upon consideration of the illustrative embodiments now to be described in detail in connection with the accompanying drawings.

In the drawings.

It is to be understood that these drawings are for purposes of illustrating the concepts of the invention and are not to scale.

DETAILED DESCRIPTION

Figure 1:
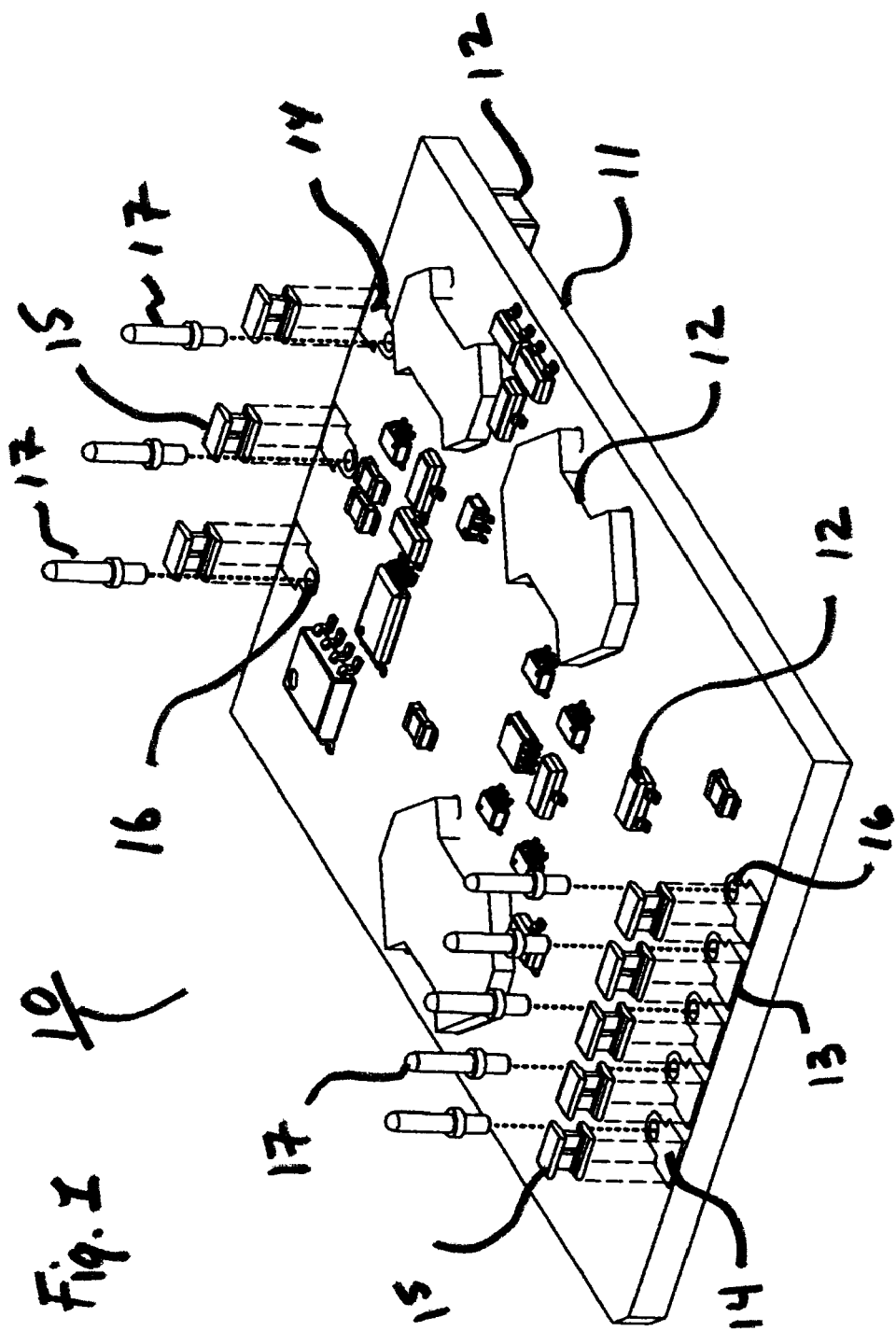
FIG. 1 is a perspective view showing a circuit module with universal connectivity.

Referring to the drawings, FIG. 1 is a perspective view showing a circuit module 10 with universal connectivity comprising a substrate or circuit board 11, one or more circuit components 12 connected to one or more dual connector mounting pads 13. Each dual connector pad 13 includes a conductive surface region 14 for receiving a surface mount connector 15 and, connected to the surface region 14, a conductive hole 16 for receiving a connector pin 17. The height of connectors 15 is greater than the height of any circuit component 12. The connectors 15 can then be placed on the pad regions 14 by standard pick-and-place techniques and secured by solder reflow. To minimize the area occupied by dual mounting pads 13, the surface mount connectors 15 should be highly compact low impedance devices preferably made of highly conductive copper or silver.

Figure 2:
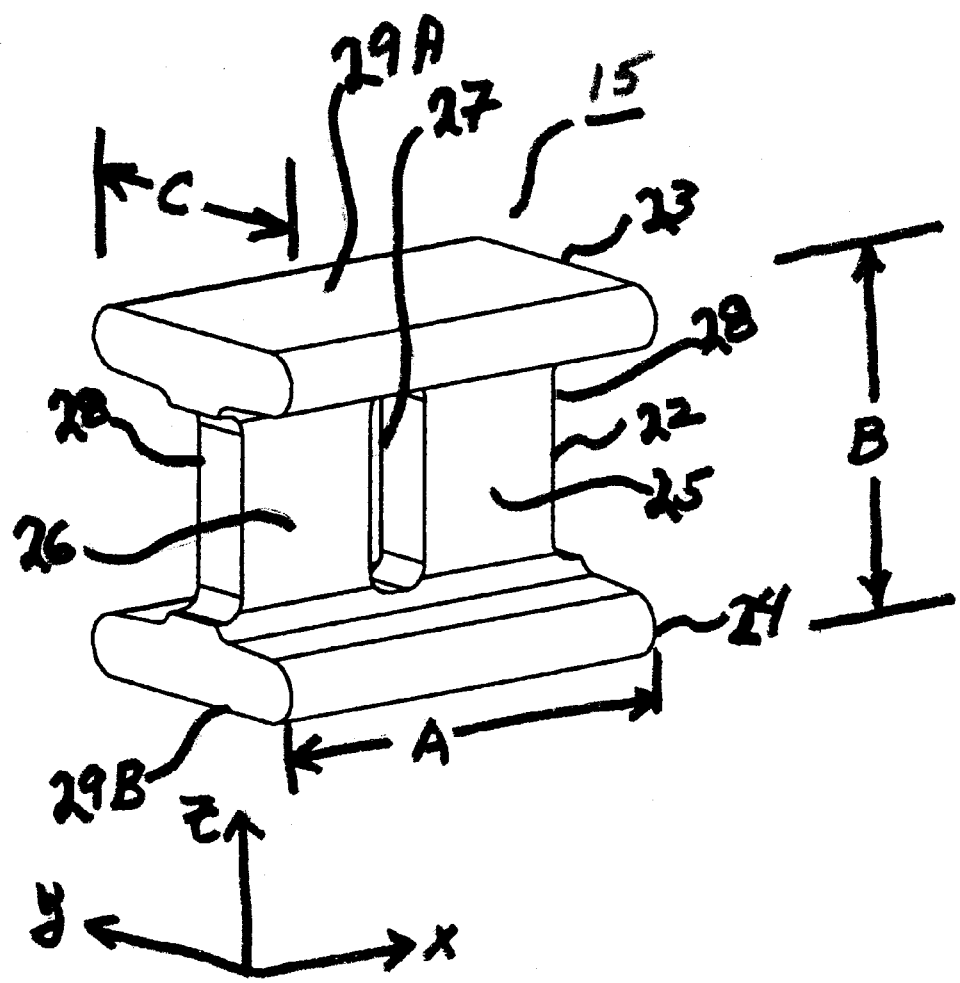
FIG. 2; is a perspective view of a compact surface mount connector particularly useful in the circuit module of FIG. 1.

FIG. 2 illustrates a preferred surface mount connector 15 for this application. The preferred connector 15 is an elongated cylindrical metallic body of "I-shaped" cross section. The connector comprises a longitudinally extending central beam section 22 having laterally extending base sections 23, 24 at both edges. The longitudinal dimension of the connector can be divided into longitudinal sections 25, 26 by one or more slots 27. The ends of the body can include recessed regions 28, which can be formed as partial slots.

With reference to the coordinate system shown in FIG. 2, the connector 15 extends longitudinally along the x-axis. The major surfaces of the beam section 22 are parallel to the x-z plane, and the major surfaces of the base sections 23, 24 are parallel to the x-y plane. In the embodiments shown herein, the connector mounting surfaces are the outer major surface 29A of base 23 and the outer major surface 29B of base 24. The connector thus provides electrical and thermal connectivity in the z-direction.

In general, the connector length A is determined by the level of acceptable impedance for the connector. The greater the length, the lower the inductance and resistance. The height B is chosen to be greater than the height of the tallest component on the interconnect side of the circuit devices to be interconnected so that the contact between the two circuit devices to be interconnected so that contact between the two circuit devices is only through the connectors. The base width C is chosen by tipping requirements for the connector, i.e. the maximum angle that the base outer surface can make with a planar substrate without falling over. Preferably the height B is greater than base width C, and the width C is sufficient to provide a tipping angle of at least 30°. The cross sectional corners of the base sections are advantageously rounded, as by a 7 mil radius, in order to provide a good fillet when soldered and thus produce reliable solder joints.

The presence and number of slots 27 is determined by the xy compliance requirements for the connector. A slot 27 will divide the beam section into two adjacent longitudinal sections 25, 26. Slots 27 should be dimensioned and placed so that the longitudinal dimension of each section 25, 26 does not exceed its height dimension. Thus if the length of a connector is less than its height, no slot is needed. If the length is greater than the height but not greater than twice the height, one slot is desirable. Recessed end regions 28 can reduce the effective length of the connector, reducing the need for slots to provide xy compliance. The optimal shape for a slot is geometrically similar to the central beam section 22, but rotated by 90°. A slot 27 can be confined to the beam section 22 as shown in FIG. 1 or can cut through one of the base sections.

These connectors can be easily fabricated by extruding a metal rod of I-shaped cross section, punching the desired slots and cutting to desired length. The connectors can achieve very low impedance (electrical and thermal) because the rods can be extruded of soft metals of high electrical and thermal conductivity such as copper or silver. Preferably the formed connector is plated with a solderable coating of Ni/Au or Ni/solder (e.g. tin-lead solder). The Ni advantageously has a thickness at least 50 microinch, the Au at least 3 microinch or the solder, at least 200 microinch.

Typical lengths A are in the range 0.030"–0.300". Typical heights B are in the range 0.040"–0.120", and typical base widths C are in the range 0.025"–0.100". The central beam section 22 typically has a thickness in the range 0.010"–0.030", and the base sections 23, 24 typically have a thickness in the range 0.010"–0.030".

Further details concerning this low impedance surface-mount connector are set forth in U.S. application Ser. No. 09/737,303 filed by A. Roy concurrently herewith and entitled "I-Channel Surface-Mount Connector." The concurrently filed application is incorporated herein by reference.

While the above-described l-channel surface mount connector is preferred because of its compact low impedance characteristics, alternative surface mount connectors can be used. See, for example, the connectors described in U.S. Pat. No. 5,588,848 issued to R. Law et al. on Dec. 31, 1996.

The connector pins 17 can conventional connective pins commonly used in the industry. They can be provided with shoulders or without. Exemplary pins 17 are described, for example, in *Microelectronics Packaging Handbook*, edited by R. R. Turmala et al., Van Nostrand Reinhold, N.Y., 1989, which is incorporated herein by reference.

The dual connector mounting pads 13 can be fabricated to include conductively-plated through holes in circuit board 11 in accordance with techniques well known in the art. The plated through holes are fabricated with an opening dimensioned for receiving pins 17 and with extended surface regions 14 of appropriate dimension for receiving a connector 15. Preferably the pads 13 comprise platings of Ni/Au or Ni/solder.

Figure 3:
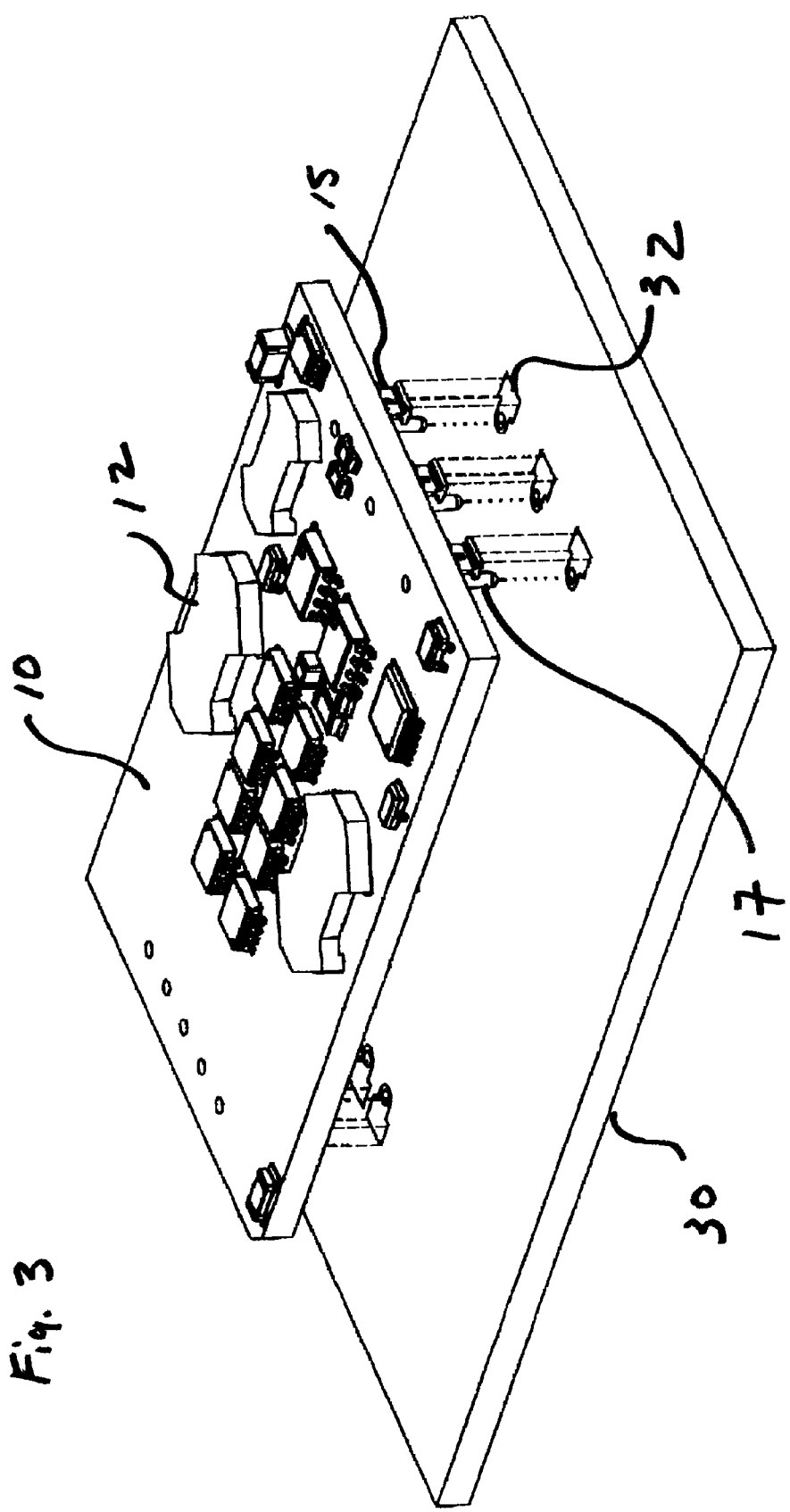
FIG. 3 is a perspective view showing how the circuit module of FIG. 1 can be connected to a circuit board.

FIG. 3 is a perspective view showing how the circuit module 10 of FIG. 1 can be connected to a circuit device 30. Device 30 can comprise a package or substrate or circuit board and is preferably the larger area circuit device of the two. As a preliminary step, the circuit device 30 is provided with solder pads 32 appropriate in size and distribution for receiving the connectors mounted on circuit device 30. Shown here, the pads 32 are dimensioned for receiving surface mount connectors 15 and/or pins 17. Alternatively, they could be only plated through holes for receiving pins 17, they could comprise a modular unit containing sockets for pins 17, or they could be pads for receiving only surface mount connectors 15. Thus the module 10 can be connected by surface mount connection or, adding pins 17, by PTH interconnect or socket connection.

The pads 32 are preferably pre-coated with solder, and the module 10 can be applied on device 30 using pick-and-place techniques with the connectors (15 and/or 17) in registration with pads 32. The two circuit devices can then be interconnected by solder reflow.

In addition to providing universal connectivity using the dominant circuit board connection schemes, this novel circuit module can provide a more precise and robust interconnection by using both the pins and the surface mount connectors together. The surface mount connectors 15 act as stops defining vertical spacing between two devices, and the pins provide precise lateral registration between the devices.

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed is:

1. A circuit device for electrical interconnection to another, the circuit device comprising:
   a substrate or circuit board having a surface containing one or more circuit components; and
   one or more dual connector mounting pads on the surface electrically connected to the circuit components, each dual connector mounting pad comprising a conductive surface region configured for mounting a surface mount connector on the surface and a conductive hole configured for mounting a connector pin on the same surface, the dual connector configured so as to allow both the surface mount connector and the connector pin to reside mounted on the same surface at the same time.

2. The circuit device of claim 1, wherein at least one of the dual connector mounting pads has mounted on it a surface mount connector conductively bonded to the conductive surface region.

3. The circuit device of claim 2 wherein the surface mount connector comprises a longitudinally extending metallic body of I-shaped transverse cross section.

4. An interconnected circuit device comprising a first circuit device according to claim 2 electrically connected to a second circuit device by the surface mount connector.

5. An interconnected circuit device according to claim 4 wherein the first circuit device comprises a plurality of the dual connector mounting pads bonded to a respective plurality of the surface mount connectors and the first circuit device is connected to the second circuit device by the surface mount connectors.

6. The circuit device of claim 1 wherein at least one of the dual connector mounting pads has mounted on it both a surface mount connector conductively bonded to the conductive surface region and a connector pin conductively bonded within the conductive hole.

7. An interconnected circuit device comprising a first circuit device according to claim 6 electrically connected to a second circuit device by either the surface mount connector, the connector pin or both.

8. An interconnected circuit device comprising a circuit device according to claim 7 wherein the first circuit device comprises a plurality of the dual connector mounting pads, each dual connector mounting pad having bonded thereto a surface mount connector and a connector pin.

9. The circuit device of claim 1 wherein at least one of the dual connector mounting pads has mounted on it a connector pin conductively bonded within the conductive hole.

10. The circuit device of claim 9 wherein the connector pin has a shoulder.

11. An interconnected circuit device comprising a first circuit device according to claim 9 electrically connected to a second circuit device by the connector pin.

12. An interconnected circuit device according to claim 11 wherein the first circuit device comprises a plurality of the dual connector mounting pads bonded to a respective plurality of the connector pins and the first circuit device is connected to the second circuit device by the connector pins.

* * * * *